United States Patent [19]

Nakamura

[11] Patent Number: 4,951,118
[45] Date of Patent: Aug. 21, 1990

[54] SEMICONDUCTOR DEVICE HAVING RESISTOR STRUCTURE

[75] Inventor: Toshio Nakamura, Tokyo, Japan

[73] Assignee: NEC Corporation, Tokyo, Japan

[21] Appl. No.: 225,653

[22] Filed: Jul. 25, 1988

Related U.S. Application Data

[63] Continuation of Ser. No. 916,409, Oct. 7, 1986.

[30] Foreign Application Priority Data

Oct. 7, 1985 [JP]  Japan ................... 60-224413

[51] Int. Cl.[5] .......................................... H01L 27/02
[52] U.S. Cl. .......................................... 357/51; 357/59
[58] Field of Search .................... 357/51, 47, 40, 59 F, 357/59 G

[56] References Cited

U.S. PATENT DOCUMENTS

| | | | |
|---|---|---|---|
| 4,057,894 | 11/1977 | Khajezadeh et al. | 357/51 |
| 4,270,137 | 5/1981 | Coe | 357/51 |
| 4,326,213 | 4/1982 | Shirai et al. | 357/51 |
| 4,420,766 | 12/1983 | Kasten | 357/59 F |
| 4,426,658 | 1/1984 | Gontowski, Jr. | 357/59 F |
| 4,446,613 | 5/1984 | Beinglass et al. | 357/51 |
| 4,455,567 | 6/1984 | Lee et al. | 357/59 F |
| 4,466,177 | 8/1984 | Chao | 357/51 |
| 4,467,519 | 8/1984 | Glang et al. | 357/51 |
| 4,541,002 | 9/1985 | Shimada | 357/59 F |
| 4,569,122 | 2/1986 | Chan | 357/51 |
| 4,754,320 | 6/1988 | Mizutani et al. | 357/51 |
| 4,763,185 | 8/1988 | Peek | 357/59 G |

FOREIGN PATENT DOCUMENTS

| | | | |
|---|---|---|---|
| 0202646 | 11/1986 | European Pat. Off. | 357/51 |
| 56-87353 | 7/1981 | Japan | 357/51 |
| 59-79584 | 5/1984 | Japan | 357/51 |
| 62-104066 | 5/1987 | Japan | 357/51 |

OTHER PUBLICATIONS

IBM Technical Bulletin, vol. 21, No. 9, Feb. 1979, "Poly Si Gate FET with Self-Registering Metal Contacts to Both Poly Si and Diffused Silicon Regions", by Rideout.

Primary Examiner—Rolf Hille
Assistant Examiner—Steven Loke
Attorney, Agent, or Firm—Burns, Doane, Swecker & Mathis

[57] ABSTRACT

A resistor structure including a resistor element and a wiring layer connected to the resistor element is formed on an insulating layer such as a field silicon oxide layer on a major surface of a semiconductor substrate. The insulating layer includes a thin portion on which the resistor element is formed.

6 Claims, 2 Drawing Sheets

SEMICONDUCTOR DEVICE HAVING RESISTOR STRUCTURE

This application is a continuation of Ser. No. 916,409, filed Oct. 7, 1986.

BACKGROUND OF THE INVENTION

The present invention relates to a semiconductor device having a resistor structure provided on an insulating layer on a semiconductor substrate.

Conventionally, the resistor element made of a polycrystalline silicon film, etc. as well as wiring layers connected to the resistor element is provided on a thick field insulating layer having substantially uniform thickness, for reducing the parasitic capacitance between the resistor element and the silicon substrate and between the wiring layer and the silicon substrate. However, the heat produced in the resistor element cannot be effectively dispersed through the thick insulating layer into the silicon substrate. If the resistor element is designed to have a large area and provided on a thicker insulating layer, on the other hand, the high integrated circuit semiconductor device cannot be realized.

SUMMARY OF THE INVENTION

Accordingly, an object of the present invention is to provide a semiconductor device having a resistor structure including a resistor element and a wiring layer connected to the resistor element, in which the heat produced in the resistor element during the operation can be effectively dispersed into the semiconductor substrate.

According to a feature of the present invention, there is provided a semiconductor device comprising a semiconductor substrate having a major surface, an insulating layer provided on the major surface of the substrate, the insulating layer including a first portion and a thinner second portion, a resistor element provided on the second portion of the insulating layer, and a wiring layer provided on the first portion of the insulating layer and connected to the end part of the resistor element. Generally, the length of the wiring layer extending on the first portion is 200 μm to 800 μm. Favorably, the thickness of the first portion ranges from 1.3 μm to 3.0 μm, and that of the second portion ranges from 0.05 μm to 0.8 μm. The first portion of the insulating layer may be constituted by multi-layered insulating films, and the second portion of the insulating layer may be constituted by only one of them. Each insulating film may be made of silicon oxide, silicon nitride or silicate glass such as phosphosilicate glass and borosilicate glass. The resistor element may be made of lightly-doped polycrystalline silicon or thin metal film such as SiCr (silicon-chromium alloy), and the wiring layer may be made of metallic film such as aluminum film or highly doped polycrystalline silicon. The insulating layer on which the resistor structure is formed may be used as the field insulator. Therefore, the thickness of the first portion of the insulating is determined so that no parasitic MOS transistor effect is produced between device elements formed in the substrate. The second portion on which the resistor element of the resistor structure is formed may be surrounded by the first portion in plan view.

DESCRIPTION OF THE PRIOR ART

Figure 1:
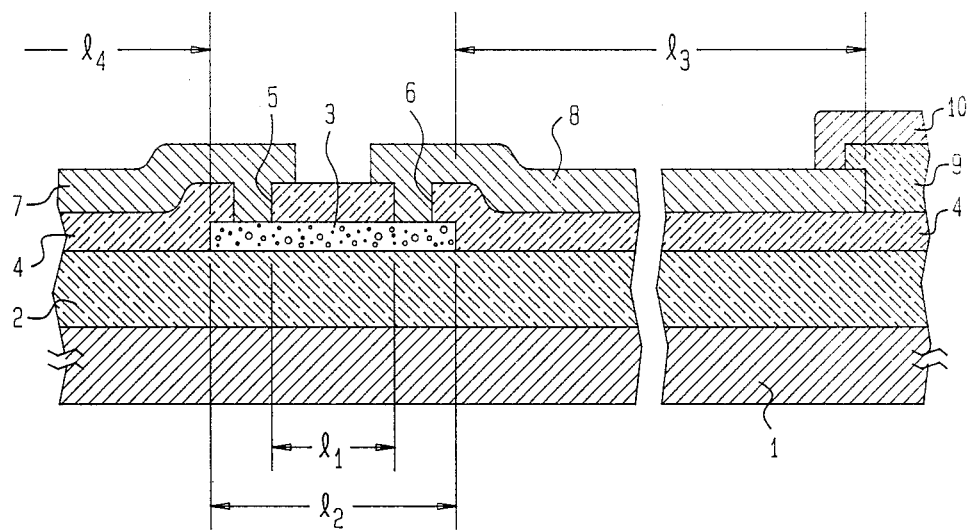
FIG. 1 is a cross-sectional view showing a semiconductor device in the prior art.

Referring to FIG. 1, on the silicon substrate 1 the field silicon oxide film 2 having the substantially uniform thickness of 1.5 μm is provided by a thermal oxidation. The polycrystalline silicon resistor element 3 having the sheet resistivity of 180 Ω/□ is provided on the field silicon oxide film 2. The aluminum wiring layers 7, 8 are connected to contact parts of the resistor element 3 at their one ends, respectively, through the openings 5, 6 in the intermediate insulating film 4 of silicon oxide having 0.2 μm thickness and extend on the film 4 at a distance $l_3$, $l_4$ of about 400 μm, respectively. The wiring layer 8 is connected to another wiring layer 10 provided on another intermediate insulating film 9 at its other end. Also, the wiring layer 7 may be connected to an upper wiring layer (not shown) or to an impurity region (not shown) in the substrate at its other end. The resistor element 3 has the width of 10 μm, the effective length $l_1$ of 25 μm and the thickness of 0.25 μm, and therefore the resistance of the resistor element becomes 450 Ω. In such a structure, when electrical current of 10 mA, 12 mA, 14 mA and 16 mA is flown, the increase of the temperature from the room temperature in the resistor element 3 becomes 25° C., 30° C., 45° C. and 85° C., respectively. On the other hand, the capacitance between the resistor element 3 and the substrate 1 can be estimated as $26 \times 10^{-6}$ (pF/μm$^2$)$\times 10 \times 39$ (total length $l_2$ of the resistor element) $\approx 10 \times 10^{-3}$ pF. If the aluminum wiring layers has the width of 6 μm, and extend 400 μm, respectively, the capacitance between the wiring layers and the substrate can be estimated as $23 \times 10^{-6}$ (pF/μm$^2$) $\times 6 \times 400 \times 2 \approx 110 \times 10^{-3}$ pF. Therefore, the total capacitance of the resistor structure including the resistor element and the wiring layers becomes about $120 \times 10^{-3}$ pF.

DESCRIPTION OF THE EMBODIMENT

Figure 2A:
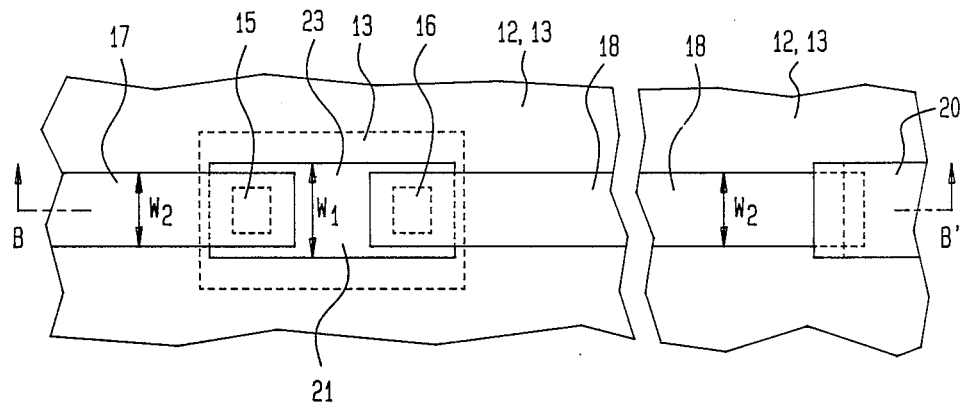
FIG. 2A is a plan view showing an embodiment of the present invention.
Figure 2B:
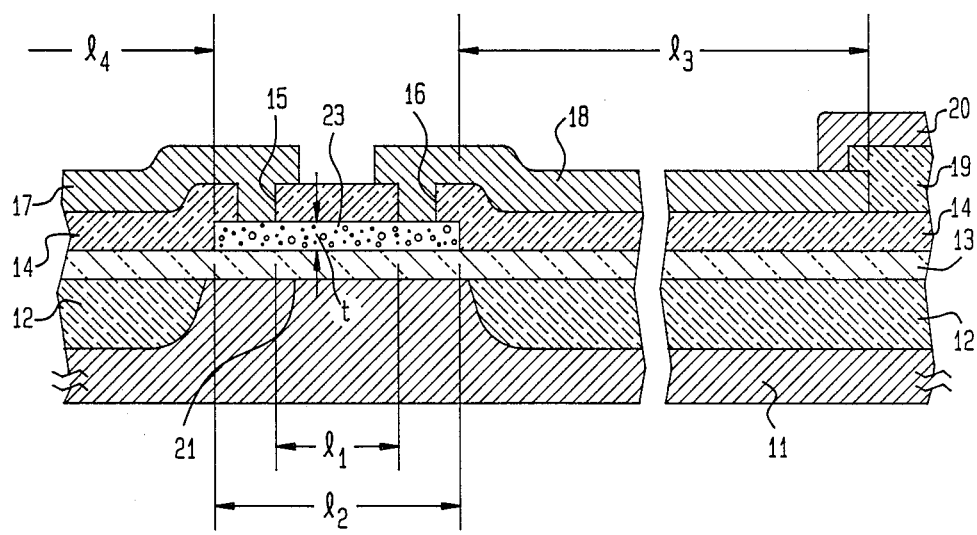
FIG. 2B is a cross-sectional view taken along line B—B' in FIG. 2A as viewed in the direction of arrows.

Referring to FIGS. 2A and 2B, through a thermal oxidation process the thick silicon oxide film 12 having the thickness of 1.0 μm is selectively formed and embedded in the silicon substrate 11 such that the surface portion 21 of the substrate and the upper surface of the silicon oxide layer 12 are substantially co-planar. The silicon oxide film 13 having the thickness of 0.5 μm is provided on the thick silicon oxide film 12 and on the surface portion 21 by CVD process, for example. The polycrystalline silicon resistor element 23 having the sheet resistivity of 180 Ω/□ is provided on the silicon oxide film 13 above the surface portion 21. The aluminum wiring layers 17, 18 are connected at contact parts of the resistor element 23 at their one ends through the contact holes 15, 16 provided in the intermediate silicon oxide film 14 having the thickness of 0.2 μm and formed by CVD process. The wiring layers 17, 18 extend on the film 14 at a distance $l_3$, $l_4$ of about 400 μm, respectively. The wiring layer 18 may be connected at its other end to the upper wiring layer 20 provided on the intermediate insulating film 19, and the wiring layer 17 also may be connected to an upper wiring layer (not shown) or to an impurity region (not shown) formed in the substrate at its other end. The resistor element 23 has the same shape as the resistor element 3 in FIG. 1. Namely, the effective length $l_1$, the width $W_1$ and the thickness t are 25 μm, 10 μm and 0.25 μm, respectively. Therefore, the resistance thereof becomes 450 Ω.

According to the present invention, when electrical current of 10 mA, 12 mA, 14 mA and 16 mA is made to flow through the resistor, the increase in the temperature from room temperature can be restrained to only 12° C., 14° C., 21° C. and 40° C., respectively. Namely, only about one half of temperature is raised in comparison with the prior art structure shown in FIG. 1. This is because, in the present invention, the silicon oxide film 13 which has a low thermal conductivity of $3.3 \times 10^{-7}$ cal/(μm·sec·° C.) has a thin thickness of 0.5 μm and under the film 13 the silicon surface portion 21 of the silicon substrate 11 which has a high thermal conductivity of $3.58 \times 10^{-5}$ cal/(μm·sec·° C.) is provided.

On the other hand, the capacitance between the resistor element 23 and the substrate 11 can be estimated as $78 \times 10^{-6}$ (pF/μm$^2$)$\times 10 \times 39$ (total length $l_2$ of the resistor element) $\approx 30 \times 10^{-3}$ pF. Total thickness of films 12, 13, 14 is 1.7 μm which is the same value as the total thickness of films 2, 4 in FIG. 1, and the width $W_2$ of the wiring layers is also 6 μm. Therefore, the capacitance between the wiring layers 17, 18 and the silicon substrate 11 becomes about $110 \times 10^{-3}$ pF, and the total capacitance of the resistor structure of the present invention becomes about $140 \times 10^{-3}$ pF. Namely, the total capacitance of the present invention is increased only by less than 20% of that of the resistor structure in the prior art.

Accordingly, the resistor element in the resistor structure of the present invention can maintain its temperature at a low level during the operation and the increase of the capacitance can be restrained in a small value. Therefore, stable, reliable and high-speed operation of the semiconductor device can be expected.

What is claimed is:

1. A semiconductor device comprising:
a semiconductor substrate having a major surface;
a field insulating layer selectively formed on said substrate and having a uniform bottom contacted to said substrate where any circuit element is free therefrom, said field insulating layer having a thickness ranging from 1.3 μm to 3.0 μm;
an island-like portion of said major surfaces of said substrate protruded from said uniform bottom of said field insulating layer, surrounded completely by said field insulating layer, and having a rectangular plan shape where by circuit element is free therefrom;
an insulating film covering and attached to said island-like portion of said major surface of said substrate, entirely, said insulating film having a uniform thickness ranging from 0.05 μm to 0.8 μm so that said insulating film is thinner than the thickness of said field insulating layer;
a resistor element formed on and attached to said insulating film only above said island-like protruded portion of said major surface of said substrate such that any part of said resistor element is not deposited on said field insulating layer and that all parts of said resistor element are isolated from said major surface of said substrate by said insulating film; and
a pair of wiring layers connected to a pair of end parts, respectively, of said resistor element above said island-like portion of said major surface of said substrate and extending above said field insulating layer.

2. A semiconductor device comprising:
a semiconductor substrate having an island-like protruded portion where any circuit element is free therefrom and a depressed portion where any circuit element is free therefrom, said depressed portion surrounding said island-like protruded portion, said island-like protruded portion having an upper surface,
a field insulating layer having an upper surface, formed on said depressed portion of said substrate and surrounding completely and island-like protruded portion of said substrate, said upper surface of said island-like protruded portion of said substrate and said upper surface of said field insulating layer being continuously provided and being substantially coplanar with each other,
a first insulating film having a uniform thickness thinner than the thickness of said field insulating layer and contacted to all parts of said upper surface of said island-like protruded portion of said substrate and to said upper surface of said field insulating layer continuously,
a resistor element formed on and attached to said first insulating film only above said island-like protruded portion of said substrate such that any part of said resistor element is free from above said field insulating layer and that all parts of said resistor element are isolated from said upper surface of said island-like protruded portion of said substrate by said first insulating film, and
a wiring layer connected to said resistor element and extending above said field insulating layer, said island-like protruded portion of said substrate being provided for only installing said resistor element thereabove, whereby the heat produced in said resistor element during operation is effectively dispersed through said first insulating film into said island-like protruded portion of said substrate.

3. The semiconductor device as claimed in claim 2 further comprising:
a second insulating film having a thickness thinner than said thickness of said field insulating layer and provided on said resistor element and between said first insulating film and said wiring layer, and
a contact hole provided in said second insulating film and reaching a part of the upper surface of said resistor element through which said wiring layer is connected to said part of said resistor element.

4. The semiconductor device as claimed in claim 3 wherein the thickness of said first insulating film ranges from 0.05 μm to 0.8 μm, and the total thickness of said first and second insulating films and said field insulating layer ranges from 1.3 μm to 3.0 μm.

5. The semiconductor device as claimed in claim 1 wherein said resistor element is made of polycrystalline silicon.

6. The semiconductor device as claimed in claim 2 wherein said wiring layer is made of metal.

* * * * *